United States Patent
Jang et al.

(10) Patent No.: US 10,475,781 B2
(45) Date of Patent: Nov. 12, 2019

(54) ELECTROSTATIC DISCHARGE PROTECTION DEVICE CAPABLE OF ADJUSTING HOLDING VOLTAGE

(71) Applicant: SAMSUNG ELECTRONICS CO., LTD., Suwon-si (KR)

(72) Inventors: Sungpil Jang, Hwasung-si (KR);
Minchang Ko, Hwasung-si (KR);
ChangSu Kim, Hwasung-si (KR);
Hangu Kim, Hwasung-si (KR);
Kyoungki Jeon, Hwasung-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/364,422

(22) Filed: Nov. 30, 2016

(65) Prior Publication Data
US 2017/0170167 A1    Jun. 15, 2017

(30) Foreign Application Priority Data
Dec. 15, 2015   (KR) .......................... 10-2015-0179368

(51) Int. Cl.
*H01L 27/02* (2006.01)
*H01L 29/74* (2006.01)
*H01L 29/66* (2006.01)

(52) U.S. Cl.
CPC ...... *H01L 27/0262* (2013.01); *H01L 29/7408* (2013.01); *H01L 27/0266* (2013.01); *H01L 29/66393* (2013.01); *H01L 29/7436* (2013.01)

(58) Field of Classification Search
CPC ............. H01L 27/0262; H01L 29/7408; H01L 27/0255; H01L 27/0266; H01L 29/66393; H01L 29/7436
See application file for complete search history.

(56) References Cited

U.S. PATENT DOCUMENTS 6,433,979 B1 * 8/2002 Yu ....................... H01L 27/0251
                                                          361/111
6,946,690 B1    9/2005 Vashchenko et al.
(Continued)

FOREIGN PATENT DOCUMENTS

| JP | 201453497 A | 3/2014 |
| KR | 100792387 B1 | 1/2008 |
| KR | 101281784 B1 | 7/2013 |

*Primary Examiner* — Mohsen Ahmadi
*Assistant Examiner* — Scott E Bauman
(74) *Attorney, Agent, or Firm* — Sughrue Mion, PLLC

(57) ABSTRACT

An electrostatic discharge protection device includes: a substrate of a second conductivity type, the substrate including a well of a first conductivity type; a cathode electrode connected to the substrate; a first diffusion region of the second conductivity type and a second diffusion region of the first conductivity type, formed in the substrate and connected to the cathode electrode; an anode electrode connected to the substrate; a third diffusion region of the second conductivity type and a fourth diffusion region of the first conductivity type, formed in the well and connected to the anode electrode; a fifth diffusion region of the first conductivity type, formed on a border of the substrate and the well; and a sixth diffusion region of the first conductivity type, formed in the substrate between the first and second diffusion regions and the fifth diffusion region and configured to receive a bias voltage from outside.

10 Claims, 14 Drawing Sheets

(56) References Cited

U.S. PATENT DOCUMENTS

| | | |
|---|---|---|
| 7,106,562 B2 | 9/2006 | Kitagawa |
| 7,110,230 B2 | 9/2006 | Van Camp et al. |
| 7,141,831 B1 * | 11/2006 | Vashchenko ........ H01L 27/0262 257/124 |
| 7,202,114 B2 | 4/2007 | Salcedo et al. |
| 7,291,887 B2 | 11/2007 | Chiu et al. |
| 7,355,252 B2 | 4/2008 | Kim et al. |
| 7,795,637 B2 | 9/2010 | Hwang |
| 7,859,804 B1 | 12/2010 | Gallerano et al. |
| 8,724,272 B2 | 5/2014 | Lin et al. |
| 2001/0007521 A1 * | 7/2001 | Chen ................... H01L 27/0255 361/56 |
| 2003/0042498 A1 * | 3/2003 | Ker .................... H01L 27/0262 257/173 |
| 2003/0090845 A1 * | 5/2003 | Ker .................... H01L 27/0262 361/56 |
| 2003/0214773 A1 | 11/2003 | Kitagawa |
| 2003/0234425 A1 | 12/2003 | Chiu et al. |
| 2005/0151160 A1 | 7/2005 | Salcedo et al. |
| 2005/0286188 A1 | 12/2005 | Camp et al. |
| 2006/0258067 A1 | 11/2006 | Jeon et al. |
| 2007/0241407 A1 | 10/2007 | Kim et al. |
| 2009/0166671 A1 | 7/2009 | Hwang |
| 2010/0044748 A1 * | 2/2010 | Lin .................... H01L 27/0262 257/124 |
| 2011/0133247 A1 * | 6/2011 | Sarbishaei .......... H01L 27/0262 257/173 |
| 2013/0279052 A1 | 10/2013 | Lin et al. |
| 2014/0061740 A1 * | 3/2014 | Ho ..................... H01L 27/0262 257/296 |
| 2015/0194420 A1 * | 7/2015 | Wang ................. H01L 27/0262 257/133 |
| 2016/0141287 A1 * | 5/2016 | He ..................... H01L 27/0262 257/133 |

* cited by examiner

ELECTROSTATIC DISCHARGE PROTECTION DEVICE CAPABLE OF ADJUSTING HOLDING VOLTAGE

CROSS-REFERENCE TO RELATED APPLICATIONS

This U.S. non-provisional patent application claims priority under 35 U.S.C. § 119 to Korean Patent Application No. 10-2015-0179368, filed on Dec. 15, 2015, the entire contents of which are hereby incorporated by reference.

BACKGROUND

1. Field

The exemplary embodiments disclosed herein relate to electrostatic discharge protection devices, and more particularly, to an electrostatic discharge protection device capable of adjusting a holding voltage.

2. Description of Related Art

A SCR (silicon controlled rectifier)-based electrostatic discharge protection device is a high efficiency device using a latch-up. However, the SCR-based electrostatic discharge protection device may become latched up while power is supplied thereto and thereby an incorrect operation may occur. A device may be damaged irreparably due to such an incorrect operation.

To prevent the SCR-based electrostatic discharge protection device from becoming latched up, one technique is to increase a holding voltage of the SCR-based electrostatic discharge protection device. Even though there has been a significant amount of effort to develop this technique of increasing a holding voltage to prevent a latch-up, there is a problem that this technique may cause an increase of a size of the SCR-based electrostatic discharge protection device or may adversely affect a deterioration characteristic of the SCR-based electrostatic discharge protection device.

SUMMARY

Exemplary embodiments disclosed herein provide an electrostatic discharge protection device.

According to an aspect of an exemplary embodiment, there is provided an electrostatic discharge protection device including: a substrate of a second conductivity type, the substrate including a well of a first conductivity type; a cathode electrode connected to the substrate; a first diffusion region of the second conductivity type and a second diffusion region of the first conductivity type, the first diffusion region and the second diffusion region being formed in the substrate and connected to the cathode electrode; an anode electrode connected to the substrate; a third diffusion region of the second conductivity type and a fourth diffusion region of the first conductivity type, the third diffusion region and the fourth diffusion region being formed in the well and connected to the anode electrode; a fifth diffusion region of the first conductivity type, the fifth diffusion region being formed on a border of the substrate and the well; and a sixth diffusion region of the first conductivity type, the sixth diffusion region being formed in the substrate between the first and second diffusion regions and the fifth diffusion region and configured to receive a bias voltage from outside.

According to an aspect of another exemplary embodiment, there is provided an electrostatic discharge protection device including: a substrate of a second conductivity type in which a first well of a first conductivity type is formed, wherein a second well of a second conductivity is formed in the first well; a cathode electrode connected to the substrate; a first diffusion region of a second conductivity type and a second diffusion region of a first conductivity type, the first diffusion region and the second diffusion region being formed in the second well and connected to the cathode electrode; an anode electrode connected to the substrate; a third diffusion region of the second conductivity type and a fourth diffusion region of the first conductivity type, the third diffusion region and the fourth diffusion region being formed in the first well and connected to the anode electrode; a fifth diffusion region formed on a border of the first well and the second well; a sixth diffusion region of the first conductivity type, the sixth diffusion region being formed in the second well between the second diffusion region and the fifth diffusion region and configured to receive a bias voltage from outside; a first gate electrode formed on a first region between the second diffusion region and the sixth diffusion region; a second gate electrode formed on a second region between the fifth diffusion region and the sixth diffusion region; a resistor connected to the cathode electrode; and a capacitor connected to the anode electrode, wherein the first gate electrode is connected to the cathode electrode through the resistor, the second gate electrode is connected to the anode electrode through the capacitor, and the first gate electrode and the second gate electrode are connected to each other.

According to an aspect of another exemplary embodiment, there is provided an electrical device including: a substrate including a well; a cathode electrode and an anode electrode forming a current path therebetween; a first diffusion region formed in the substrate and connected to the cathode electrode; a second diffusion region formed on a border of the substrate and the well; and a third diffusion region formed between the first diffusion region and the second diffusion region, wherein the third diffusion region is configured to adjust a length of the current path.

BRIEF DESCRIPTION OF THE DRAWINGS

These and/or other aspects of the exemplary embodiments will become apparent and more readily appreciated from the following description of the exemplary embodiments, taken in conjunction with the accompanying drawings of which.

DETAILED DESCRIPTION

Figure 1:
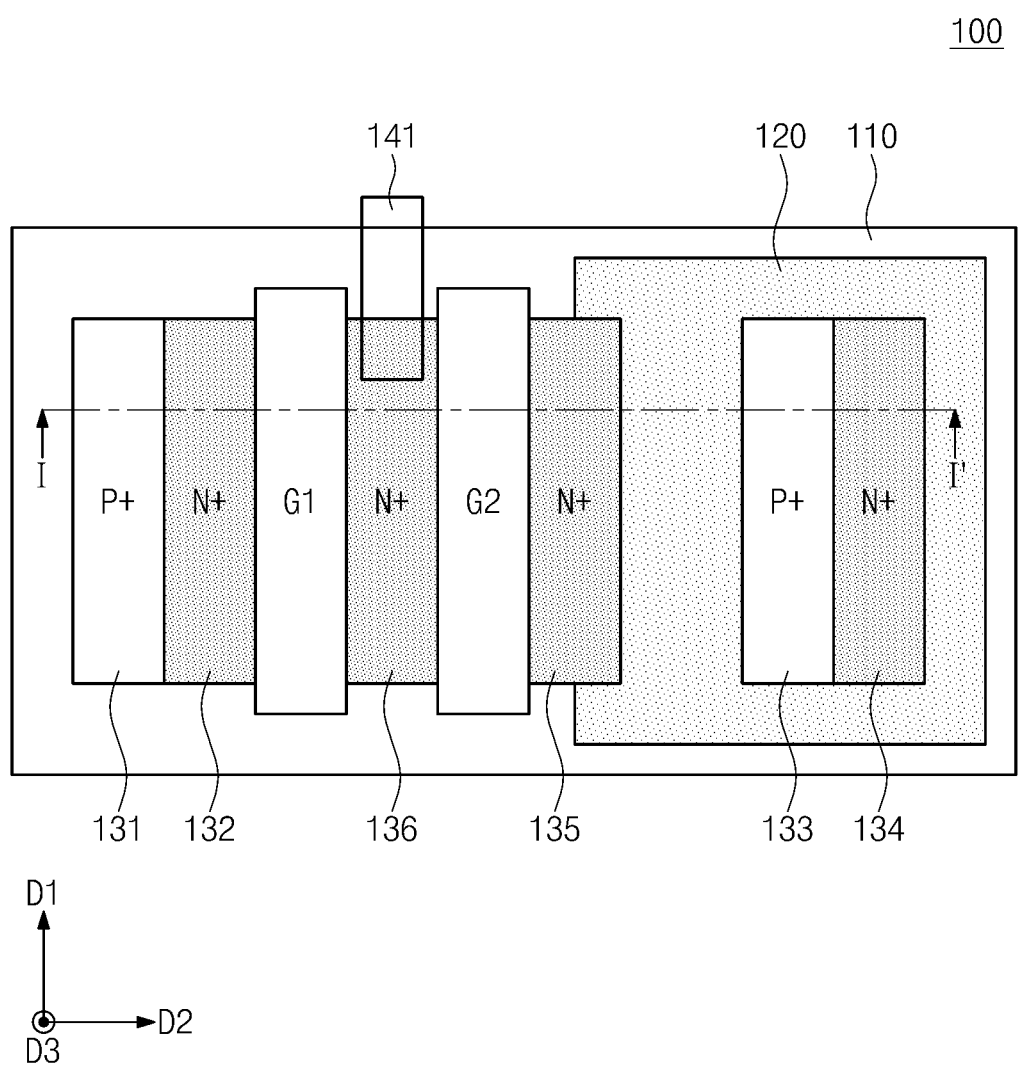
FIG. 1 is a top plan view illustrating an electrostatic discharge protection device in accordance with an exemplary embodiment.

Exemplary embodiments will be described more fully hereinafter with reference to the accompanying drawings, in which certain exemplary embodiments are shown. The exemplary embodiments may, however, be embodied in many different forms and should not be construed as limited to the exemplary embodiments set forth herein. Rather, these exemplary embodiments are provided so that this disclosure will be thorough and complete, and will fully convey the scope of the exemplary embodiments to those skilled in the art. In the drawings, the size and relative sizes of layers and regions may be exaggerated for clarity. Like numbers refer to like elements throughout.

It will be understood that when an element is referred to as being "connected" or "coupled" to another element, the element can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on", etc.) As used herein, the term "and/or" includes any and all combinations of one or more of the associated listed items and may be abbreviated as "/".

It will be understood that, although the terms first, second, etc., may be used herein to describe various elements, components, regions, layers and/or sections, these elements, components, regions, layers and/or sections should not be limited by these terms. These terms are only used to distinguish one element from another. For example, a first region/layer could be termed a second region/layer, and, similarly, a second region/layer could be termed a first region/layer without departing from the teachings of the disclosure.

The terminology used herein is for the purpose of describing particular exemplary embodiments only and is not intended to be limiting of the exemplary embodiments. As used herein, the singular forms "a", "an" and "the" are intended to include the plural forms as well, unless the context clearly indicates otherwise. It will be further understood that the terms "comprises" and/or "comprising," or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof. Expressions such as "at least one of", when preceding a list of elements, modify the entire list of elements and do not modify the individual elements of the list.

Figure 2:
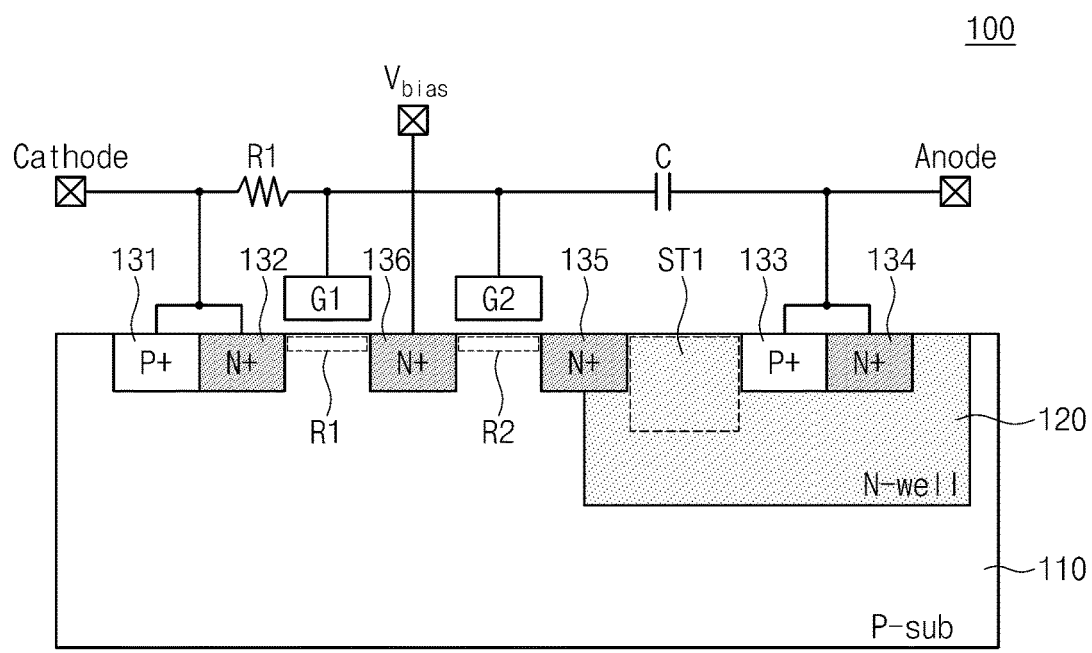
FIG. 2 is a cross sectional view taken along the line I-I' of the electrostatic discharge protection device illustrated in FIG. 1.

FIG. 1 is a top plan view illustrating an electrostatic discharge protection device 100 in accordance with an exemplary embodiment. FIG. 2 is a cross sectional view taken along the line I-I' of the electrostatic discharge protection device 100 illustrated in FIG. 1.

Referring to FIGS. 1 and 2, the electrostatic discharge protection device 100 includes a P type substrate 110, an N well 120 formed in the P type substrate 110, a first diffusion region 131 and a second diffusion region 132 that are formed in the substrate 110, a third diffusion region 133 and a fourth diffusion region 134 that are formed in the N well 120, a fifth diffusion region 135 formed on the border of the substrate 110 and the N well 120, and a sixth diffusion region 136 formed between the second diffusion region 132 and the fifth diffusion region 135. The first to sixth diffusion regions 131~136 may be formed to extend in a first direction D1 along a second direction D2.

The electrostatic discharge protection device 100 may include a first gate electrode G1 formed on a first region R1 between the second diffusion region 132 and the sixth diffusion region 136. The first diffusion region 131 and the second diffusion region 132 may be formed to be adjacent to each other. The third diffusion region 133 and the fourth diffusion region 134 may be formed to be adjacent to each other. The first gate electrode G1 and the second gate electrode G2 may be formed to extend in the first direction D1 along the second direction D2.

The N well 120 may be doped with low concentration N type impurities. The first diffusion region 131 and the third diffusion region 133 may be P type conductivity type regions. The second diffusion region 132, the fourth diffusion region 134, the fifth diffusion region 135 and the sixth diffusion region 136 may be N type conductivity type regions. For example, the second diffusion region 132, the fourth diffusion region 134, the fifth diffusion region 135 and the sixth diffusion region 136 may be regions doped with higher concentration N type impurities than the N well 120.

The electrostatic discharge protection device 100 may include a second gate electrode G2 formed on a second region R2 between the fifth diffusion region 135 and the sixth diffusion region 136. The electrostatic discharge protection device 100 may further include a first insulating layer provided between the first region R1 and the first gate electrode G1, and a second insulating layer provided between the second region R2 and the second gate electrode G2. A channel of a first NMOS transistor generated by the first gate electrode G1, the second diffusion region 132 and the sixth diffusion region 136 may be formed in the first region R1. A channel of a second NMOS transistor generated by the second gate electrode G2, the fifth diffusion region 135 and the sixth diffusion region 136 may be formed in the second region R2. The electrostatic discharge protection device 100 may further include a device isolation layer STI, which may be formed using a shallow-trench isolation technology, provided between the third diffusion region 133 and the fifth diffusion region 135.

A bias voltage Vbias may be supplied to the sixth diffusion region 136. For example, the bias voltage Vbias may be provided to the sixth diffusion region 136 through a conductive line 141. The first diffusion region 131 and the second diffusion region 132 may be connected to a cathode electrode. For example, a ground voltage may be provided through the cathode electrode. The third diffusion region 133 and the fourth diffusion region 134 may be connected to an anode electrode. For example, an electrostatic discharge (ESD) current may be input through the anode electrode. The ESD current may be a current (e.g., a surge current) that significantly changes during a short period of time. The first diffusion region 131, the second diffusion region 132 and the first gate electrode G1 may be connected to one another through a first resistor R1. The third diffusion region 133, the fourth diffusion region 134 and the second gate electrode G2 may be connected to one another through a capacitor C. The first gate electrode G1 and the second gate electrode G2 may be connected to each other.

To connect the above-mentioned elements to one another, a conductive line that connects the first diffusion region 131 and the second diffusion region 132 to the cathode electrode, a conductive line that connects the third diffusion region 133 and the fourth diffusion region 134 to the anode electrode, and a conductive line that connects the first gate electrode G1 to the second gate electrode G2 may be further provided.

According to exemplary embodiments, to adjust a holding voltage of the electrostatic discharge protection device 100, a sixth diffusion region 136 for receiving a bias voltage Vbias from the outside may be provided. When an ESD current is input through the anode electrode, the bias voltage Vbias is applied to the sixth diffusion region 136 to increase a level (e.g., voltage level) of the holding voltage, thereby improving performance of the electrostatic discharge protection device 100.

Figure 3:
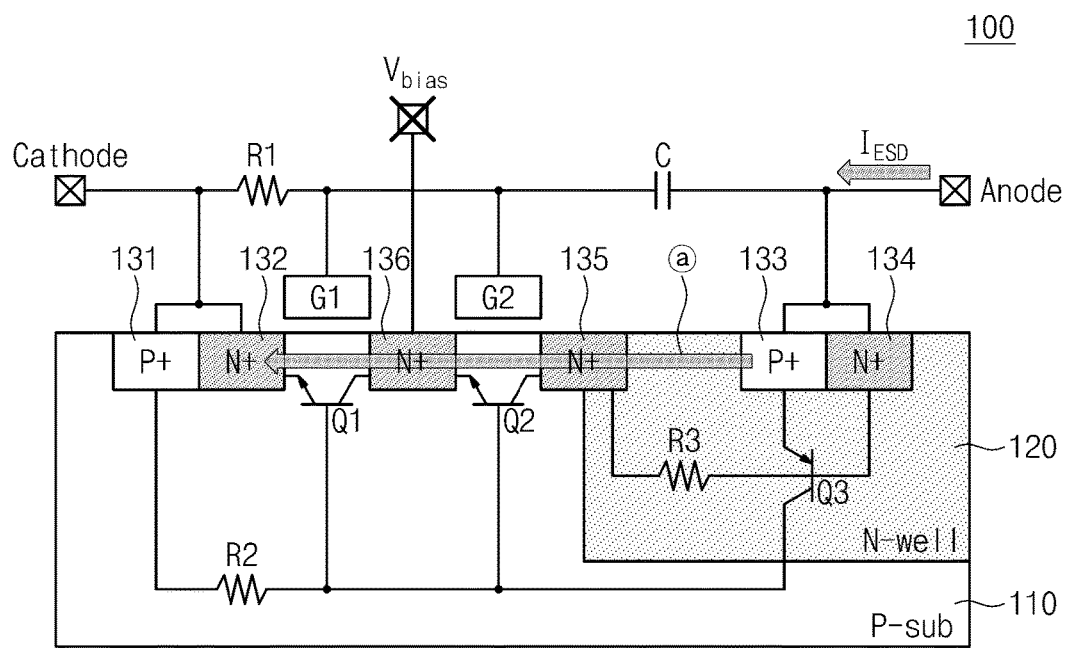
FIG. 3 is a cross sectional view taken along the line I-I' of the electrostatic discharge protection device illustrated in FIG. 1.
Figure 4:
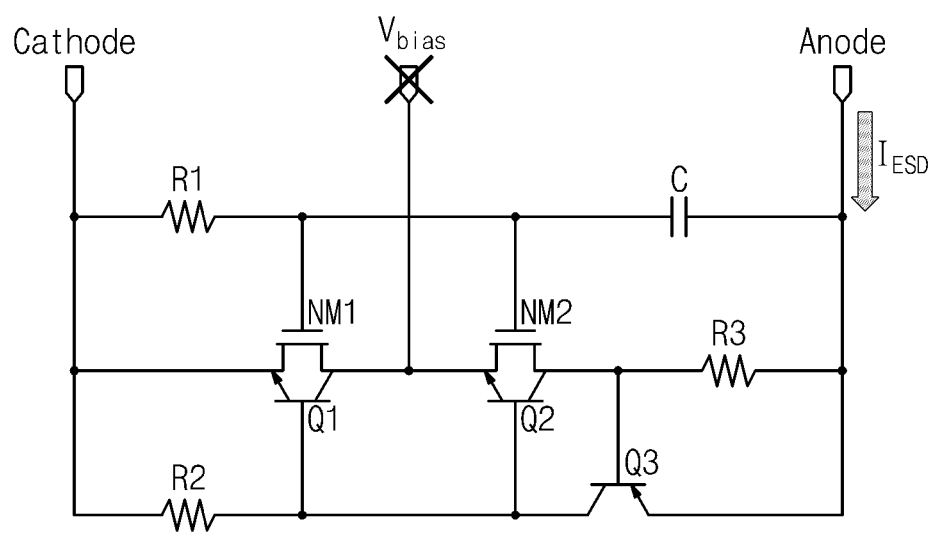
FIG. 4 is an illustrative equivalent circuit of the electrostatic discharge protection device illustrated in FIG. 3.

FIG. 3 illustrates a case in which a bias voltage Vbias is not applied to the sixth diffusion region 136 of the electrostatic discharge protection device 100. FIG. 4 is an illustrative equivalent circuit of an electrostatic discharge protection device illustrated in FIG. 3. In the present exemplary embodiment, a case in which the ESD current $I_{ESD}$ is input to the anode electrode and the bias voltage Vbias is not applied to the sixth diffusion region 136 will be described.

Referring to FIGS. 3 and 4, when the ESD current $I_{ESD}$ is input to the anode electrode, the second NMOS transistor constituted by the second gate electrode G2, the fifth diffusion region 135, and the sixth diffusion region 136 may be driven. In this case, the fifth diffusion region 135 may be a drain terminal of the second NMOS transistor and the sixth diffusion region 136 may be a source terminal of the second NMOS transistor. When the ESD current $I_{ESD}$ is input to the anode electrode, the first NMOS transistor constituted by the first gate electrode G1, the second diffusion region 132, and the sixth diffusion region 136 may be driven. In this case, the sixth diffusion region 136 may be a drain terminal of the first NMOS transistor and the second diffusion region 132 may be a source terminal of the first NMOS transistor. As a result, a current path passing through a third resistor R3, the second NMOS transistor, and the first NMOS transistor may be formed. In this case, the time when the first NMOS transistor and the second NMOS transistor are turned on may be determined by a time constant (R1×C). That is, the first resistor R1 and the capacitor C may be used to adjust a level of a trigger voltage for driving the electrostatic discharge protection device 100.

When the ESD current $I_{ESD}$ is input to the anode electrode, a first BJT (bipolar junction transistor) Q1 may be formed by an NPN junction of the second diffusion region 132, the P type 110, and the sixth diffusion region 136. A second BJT (Q2) may also be formed by an NPN junction of the sixth diffusion region 136, the P type 110, and the fifth diffusion region 135. As a result, a current path ⓐ passing through the N well 120, the second BJT (Q2), and the first BJT (Q1) may be formed. The BJTs generated when the ESD current $I_{ESD}$ is input may be parasitic BJTs. A current path passing through the BJTs is a main path for discharging the ESD current $I_{ESD}$.

A third BJT (Q3) may be formed by a PNP junction of the third diffusion region 133, the P type 110, and the first diffusion region 131.

In the present exemplary embodiment, when the ESD current $I_{ESD}$ is input to a base terminal of the third BJT (Q3), the third BJT (Q3) is turned on. A current flowing through the third BJT (Q3) is input to a base terminal of the first BJT (Q1) and a base terminal of the second BJT (Q2) to turn on the first BJT (Q1) and the second BJT (Q2). Consequently, the ESD current $I_{ESD}$ may be grounded through the cathode electrode. In a case in which the bias voltage Vbias is not applied, the current path ⓐ through the BJTs passes through the second BJT (Q2) and the first BJT (Q1). The current path ⓐ has the shortest distance which is a relatively straight line represented by an arrow illustrated in FIG. 3.

Figure 5:
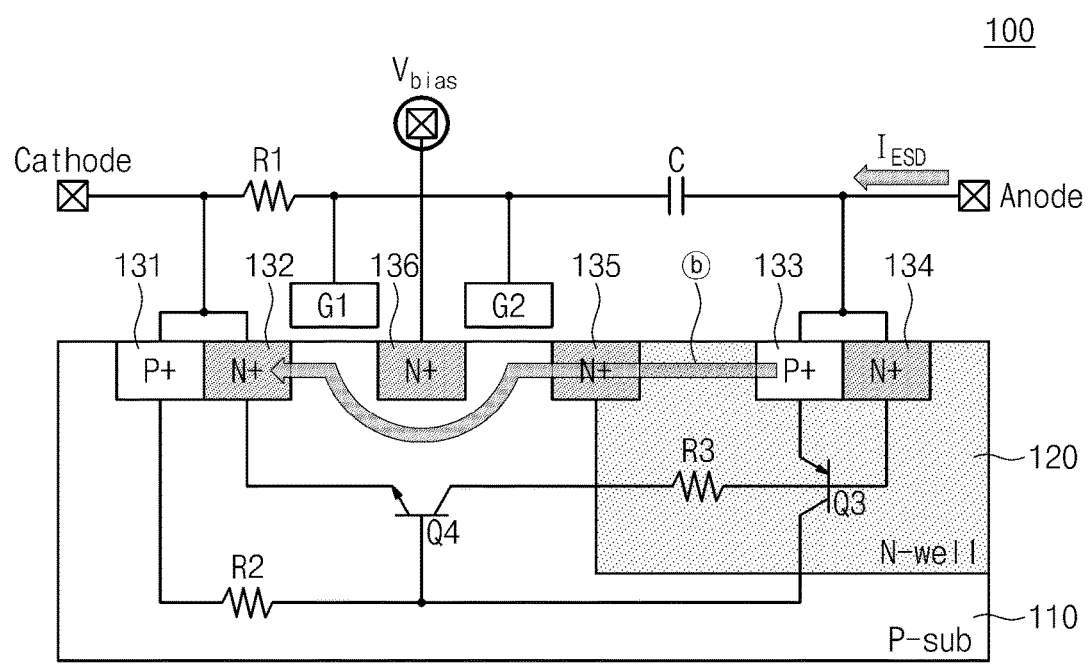
FIG. 5 illustrates a case in which a bias voltage is applied to a sixth diffusion region of an electrostatic discharge protection device illustrated in FIG. 2.
Figure 5:
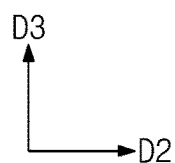
Figure 6:
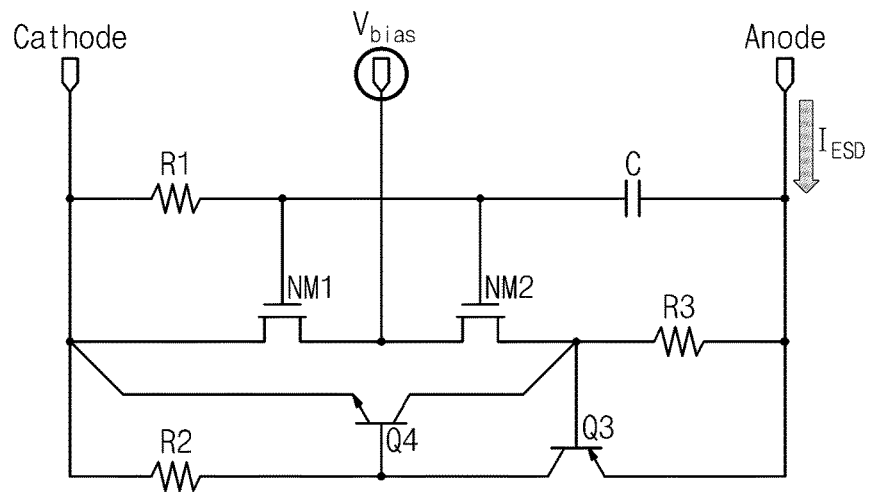
FIG. 6 is an illustrative equivalent circuit of the electrostatic discharge protection device illustrated in FIG. 5.

FIG. 5 illustrates a case in which a bias voltage is applied to a sixth diffusion region 136 of an electrostatic discharge protection device 100 illustrated in FIG. 2. FIG. 6 is an illustrative equivalent circuit of an electrostatic discharge protection device illustrated in FIG. 5. In the present exemplary embodiment, a case in which the ESD current $I_{ESD}$ is input to the anode electrode and the bias voltage Vbias is applied to the sixth diffusion region 136 will be described.

Figure 7:
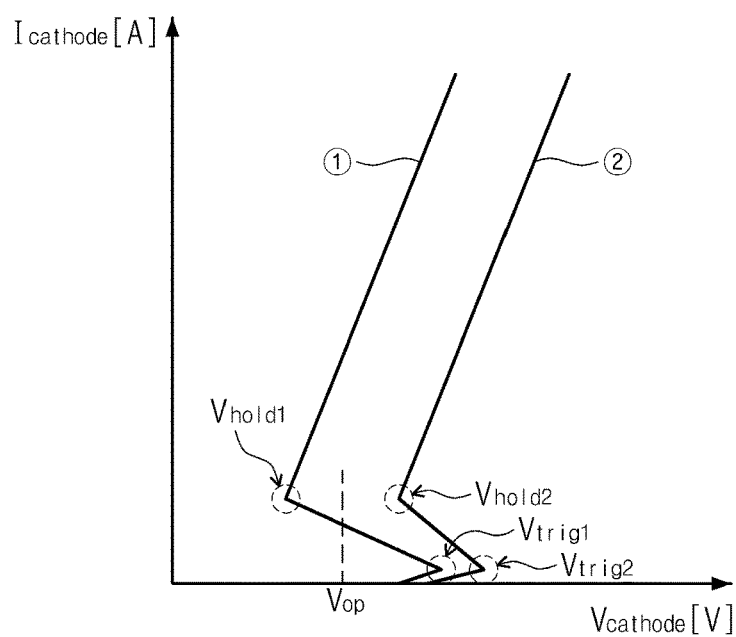
FIG. 7 is a graph illustrating a voltage-current characteristic of an electrostatic discharge protection device in accordance with an exemplary embodiment.

Unlike the example described in FIGS. 3 and 4, when a bias voltage Vbias higher than a specific voltage level is applied to the sixth diffusion region 136, the second BJT (Q2) is turned off. This result is because a reverse bias is applied between the base terminal 110 of the second BJT (Q2) and the emitter terminal 136 thereof. Instead of the second BJT (Q2) being turned on, a fourth BJT (Q4) constituted by the second diffusion region 132, the P type substrate 110 and the fifth diffusion region 135 is turned on. In this case, a current path ⓑ has a shape represented as an arrow including a curved portion and a length thereof is relatively longer than a length of the current path ⓐ illustrated in FIG. 3. As a level of the bias voltage Vbias becomes higher, the current path ⓑ may be formed such that the ESD current $I_{ESD}$ flows through a deeper region of the P type substrate 110. If a resistance of the electrostatic discharge protection device 100 increases due to an increase of the current path, a level of a holding voltage of the electrostatic discharge protection device 100 may increase. FIG. 7 illustrates an increase of a level of a holding voltage of the electrostatic discharge protection device 100.

FIG. 7 is a graph illustrating a voltage-current characteristic of an electrostatic discharge protection device in accordance with an exemplary embodiment. A horizontal axis of the graph is a voltage of the cathode electrode of the electrostatic discharge protection device 100 described in FIGS. 2 to 6 and a vertical axis represents a cathode current. A graph labeled ① is a graph of when the bias voltage Vbias is not applied to the sixth diffusion region 136 and a graph labeled ② is a graph of when the bias voltage Vbias is applied to the sixth diffusion region 136.

Referring to the graph ①, a voltage level of the anode electrode increases by an inflow of the ESD current $I_{ESD}$ to reach a first trigger voltage Vtrig1. In response to the voltage level reaching the first trigger voltage Vtrig1, the electrostatic discharge protection device 100 operates and thereby the ESD current $I_{ESD}$ may be discharged to the cathode electrode. The trigger voltage may refer to a voltage for driving the electrostatic discharge protection device 100. As the electrostatic discharge protection device 100 discharges the ESD current $I_{ESD}$, a voltage of the anode electrode reaches a first holding voltage Vhold1. If the first holding voltage Vhold1 is lower than a level of an operation voltage Vop, the electrostatic discharge protection device 100 becomes latched up and thereby an incorrect operation may occur in the electrostatic discharge protection device 100. The operation voltage Vop may refer to a voltage for driving a chip to prevent damage due to the ESD current $I_{ESD}$ by using the electrostatic discharge protection device 100.

According to exemplary embodiments, to prevent an incorrect operation due to a latch-up of the electrostatic discharge protection device 100, the bias voltage Vbias may be applied to the sixth diffusion region 136 so that the electrostatic discharge protection device 100 has a holding voltage (e.g., Vhold2) that is higher than the operation voltage Vop. As described in FIG. 5, a current path passing through the BJTs may be formed, for example, as the path ⓑ by applying the bias voltage Vbias to the sixth diffusion region 136. As a result, since a resistance of the current path increases due to an increase of a length of the current path, a level (e.g., voltage level) of the holding voltage of the electrostatic discharge protection device 100 may be increased. According to an exemplary embodiment, a level of the holding voltage may be changed by changing a level of the bias voltage Vbias being applied to the sixth diffusion region 136. Since the electrostatic discharge protection device 100 maintains the first holding voltage Vhold1 in a state where a device (e.g., solid state drive (SSD), smart phone) including the electrostatic discharge protection device 100 is powered off, damage due to deterioration can be minimized.

Figure 8:
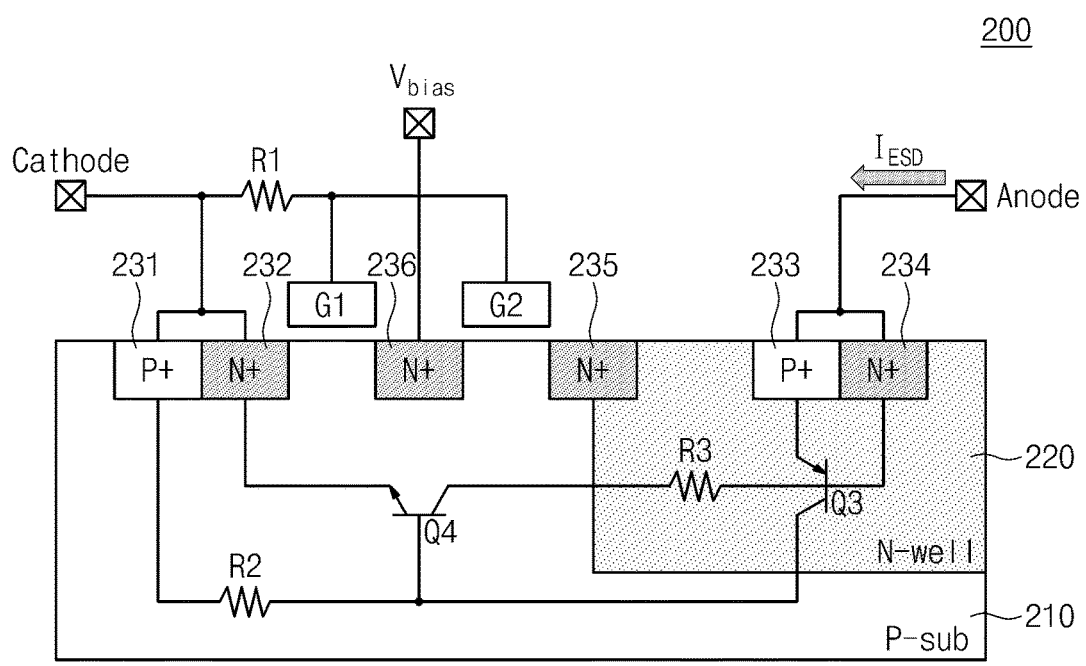
FIG. 8 is a cross sectional view of an electrostatic discharge protection device in accordance with another exemplary embodiment.
Figure 9:
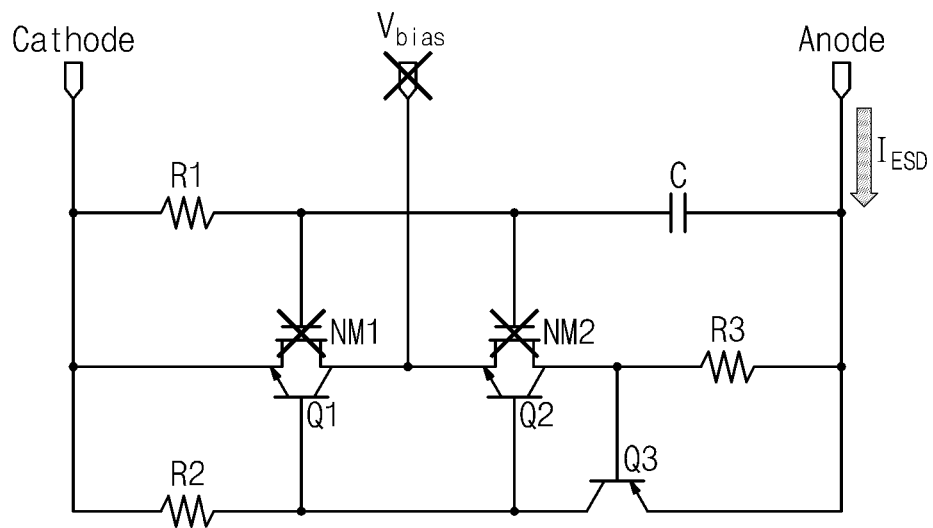
FIGS. 9 and 10 are illustrative equivalent circuits of the electrostatic discharge protection device illustrated in FIG. 8.
Figure 10:
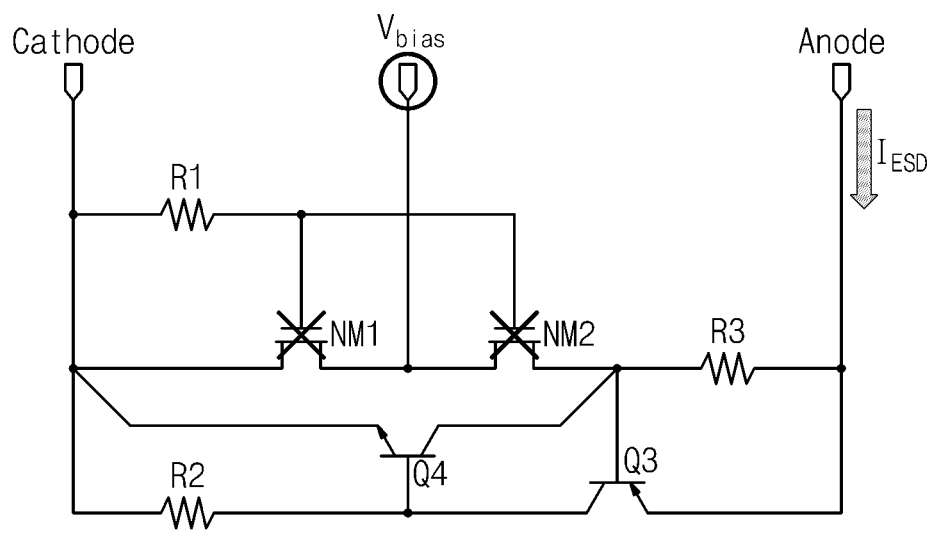

FIG. 8 is a cross-sectional view of an electrostatic discharge protection device 200 in accordance with another exemplary embodiment. FIGS. 9 and 10 are illustrative equivalent circuits of the electrostatic discharge protection device illustrated in FIG. 8. FIG. 9 illustrates a case in which a bias voltage Vbias is not applied to a sixth diffusion region 236. FIG. 10 illustrates a case in which the bias voltage Vbias is applied to the sixth diffusion region 236. The electrostatic discharge protection device 200 is similar to the electrostatic discharge protection device 100 described in FIGS. 2 to 6, except that the electrostatic discharge protection device 200 excludes the capacitor C. Thus, a description of common features already discussed with respect to the electrostatic discharge protection device 100 is omitted.

Referring to FIG. 8, the electrostatic discharge protection device 200 includes a first diffusion region 231, a second diffusion region 232, a third diffusion region 233, a fourth diffusion region 234, a fifth diffusion region 235, a sixth diffusion region 236, a substrate 210 (e.g., P-type substrate), and an N-well 220. A first gate electrode G1 and a second gate electrode G2 are not connected to an anode electrode. The first gate electrode G1 and the second gate electrode G2 are connected to a cathode electrode through a first resistor R1. That is, a gate electrode G1 of a first NMOS transistor constituted by the first gate electrode G1, the second diffusion region 232, and the sixth diffusion region 236 is always grounded. Similarly, a gate electrode G2 of a second NMOS transistor constituted by the second gate electrode G2, the fifth diffusion region 235, and the sixth diffusion 236 is always grounded. Thus, the first NMOS transistor and the second NMOS transistor are always turned off.

Referring to FIGS. 8 and 9, when the bias voltage Vbias is not applied to the sixth diffusion region 236, a first BJT (Q1) constituted by the second diffusion region 232, the substrate 210, and the sixth diffusion region 236 is turned on. A second BJT (Q2) constituted by the fifth diffusion region 235, the substrate 210, and the sixth diffusion region 236 is turned on. Thus, an ESD current $I_{ESD}$ input to the anode electrode flows into the cathode electrode through a path to the path (e.g., path ⓐ illustrated in FIG. 3.

Referring to FIGS. 8 and 10, when the bias voltage Vbias is applied to the sixth diffusion region 236, the second BJT (Q2) is turned off by a reverse bias. A fourth BJT (Q4) constituted by the second diffusion region 232, the substrate 210 and the fifth diffusion region 235 is instead turned on. As a result, an ESD current $I_{ESD}$ input to the anode electrode flows into the cathode electrode through a path to the path (e.g., path ⓑ illustrated in FIG. 5. That is, since a resistance of the electrostatic discharge protection device 200 increases due to an increase of a length of the current path, a level of a holding voltage of the electrostatic discharge protection device 200 may be increased.

Figure 11:
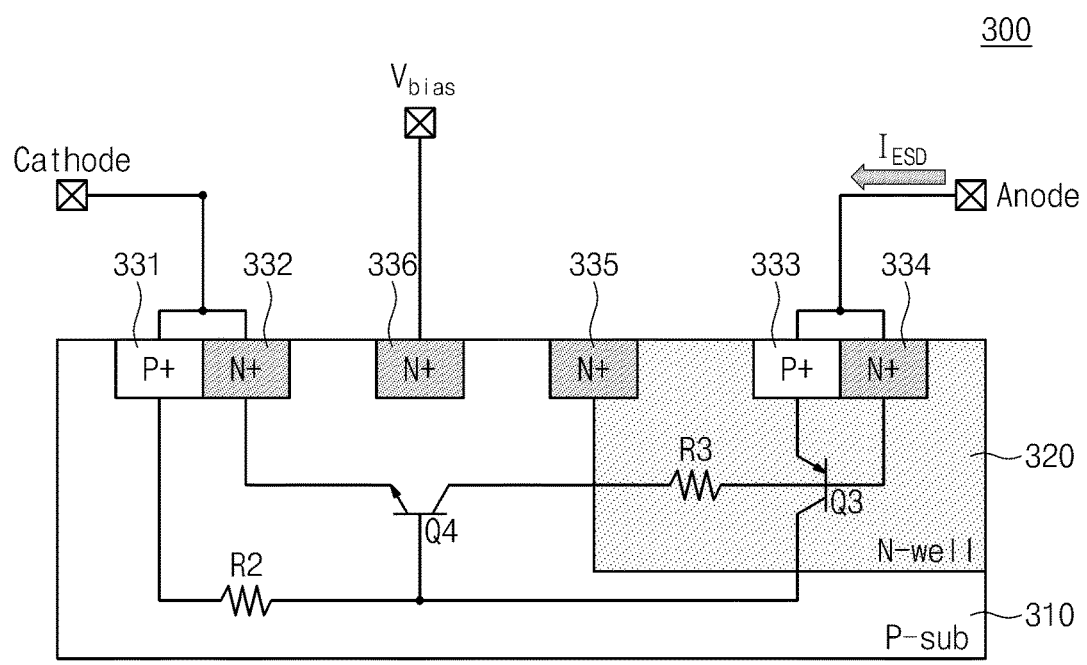
FIG. 11 is a cross sectional view of an electrostatic discharge protection device in accordance with another exemplary embodiment.
Figure 12:
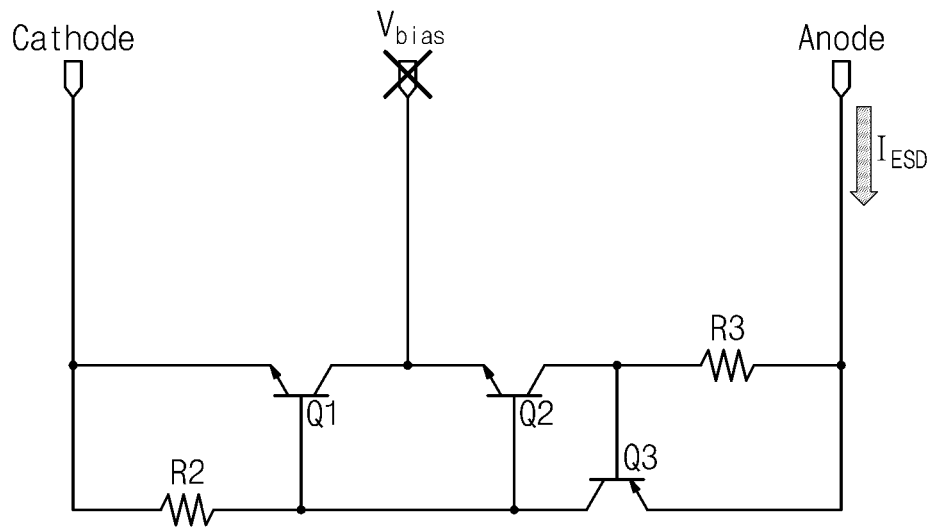
FIGS. 12 and 13 are illustrative equivalent circuits of the electrostatic discharge protection device illustrated in FIG. 11.
Figure 13:
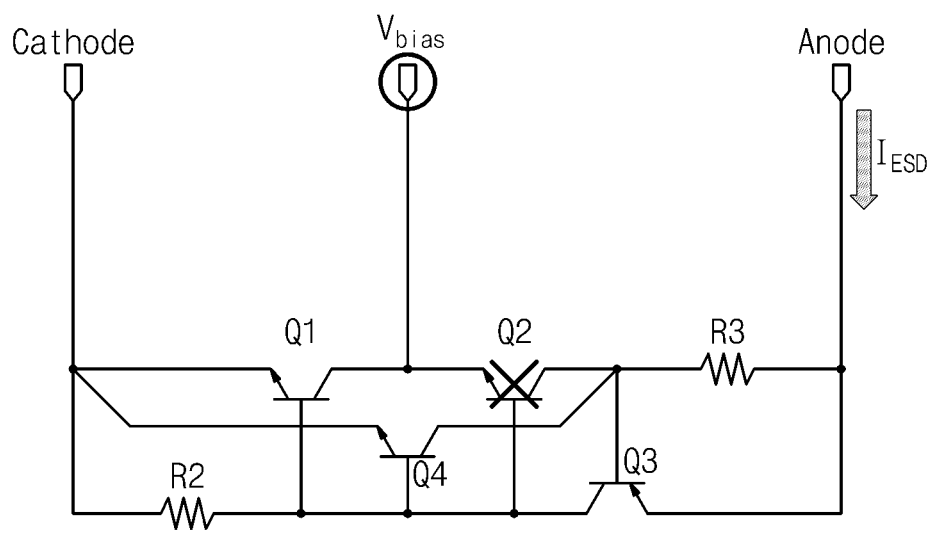

FIG. 11 is a cross-sectional view of an electrostatic discharge protection device 300 in accordance with another exemplary embodiment. FIGS. 12 and 13 are illustrative equivalent circuits of the electrostatic discharge protection device illustrated in FIG. 11. FIG. 12 illustrates a case in which a bias voltage Vbias is not applied to a sixth diffusion region 336. FIG. 13 illustrates a case in which the bias voltage Vbias is applied to the sixth diffusion region 336. The electrostatic discharge protection device 300 is similar to the electrostatic discharge protection device 100 described in FIGS. 2 to 6, except that the electrostatic discharge protection device 300 excludes the first gate electrode G1, the second gate electrode G2, the first resistor R1, and the capacitor C. Thus, a description of common features already discussed with respect to the electrostatic discharge protection device 100 is omitted.

Referring to FIGS. 11 and 12, the electrostatic discharge protection device 300 includes a first diffusion region 331, a second diffusion region 332, a third diffusion region 333, a fourth diffusion region 334, a fifth diffusion region 335, a sixth diffusion region 336, a substrate 310 (e.g., P type substrate), and an N-well 320. When the bias voltage Vbias is not applied to the sixth diffusion region 336, a first BJT (Q1) constituted by a second diffusion region 332, the substrate 310, and the sixth diffusion region 336 is turned on. A second BJT (Q2) constituted by the fifth diffusion region 335, the substrate 310, and the sixth diffusion region 336 is turned on. Thus, an ESD current $I_{ESD}$ input to an anode electrode flows into the cathode electrode through a path to a path (e.g., path ⓐ illustrated in FIG. 3.

Referring to FIGS. 11 and 13, when the bias voltage Vbias is applied to the sixth diffusion region 336, the second BJT (Q2) is turned off by a reverse bias. A fourth BJT (Q4) constituted by the second diffusion region 332, the substrate 310 and the fifth diffusion region 335 is instead turned on. As a result, an ESD current $I_{ESD}$ input to the anode electrode flows into the cathode electrode through a path similar to a path (e.g., path ⓑ illustrated in FIG. 5. That is, since a resistance of the electrostatic discharge protection device 300 increases due to an increase of a length of the current path, a level of a holding voltage of the electrostatic discharge protection device 300 may be increased.

Figure 14:
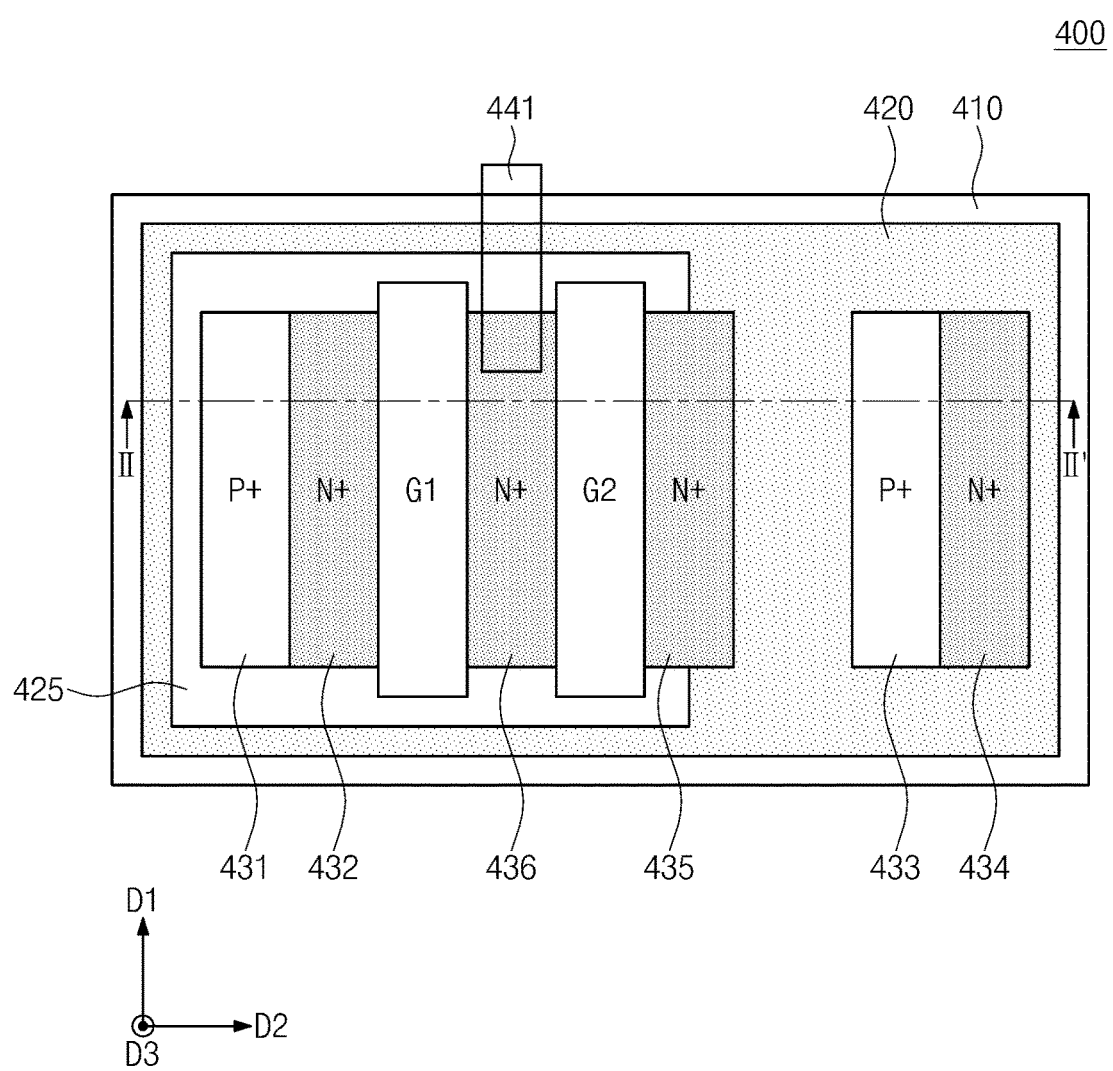
FIG. 14 is a top plan view illustrating an electrostatic discharge protection device in accordance with another exemplary embodiment.
Figure 15:
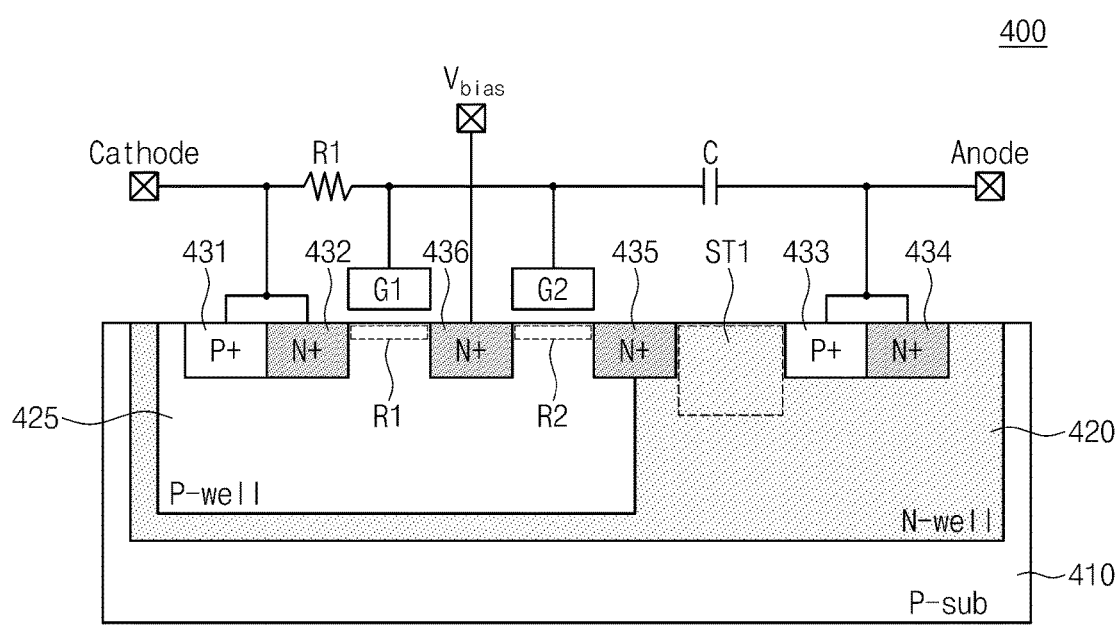
FIG. 15 is a cross sectional view taken along the line II-II' of the electrostatic discharge protection device illustrated in FIG. 14.

FIG. 14 is a top plan view illustrating an electrostatic discharge protection device 400 in accordance with another exemplary embodiment. FIG. 15 is a cross sectional view taken along the line II-II' of an electrostatic discharge protection device illustrated in FIG. 14.

Referring to FIGS. 14 and 15, an electrostatic discharge protection device 400 includes a P type substrate 410, an N well 420 formed on the P type substrate 410, a P well 425 formed in the N well 420, a first diffusion region 431 and a second diffusion region 432 that are formed in the P well 425, a third diffusion region 433 and a fourth diffusion region 434 that are formed in the N well 420, a fifth diffusion region 435 formed on the border of the P well 425 and the N well 120, and a sixth diffusion region 436 formed between the second diffusion region 432 and the fifth diffusion region 435. The first to sixth diffusion regions 431~436 may be formed to extend in a first direction D1 along a second direction D2.

The electrostatic discharge protection device 400 further includes a first gate electrode G1 formed on a first region R1 between the second diffusion region 432 and the sixth diffusion region 436. The first diffusion region 431 and the second diffusion region 432 may be formed to be adjacent to each other. The third diffusion region 433 and the fourth diffusion region 434 may be formed to be adjacent to each other. The first gate electrode G1 and the second gate electrode G2 may be formed to extend in the first direction D1 along the second direction D2.

The N well 420 may be doped with low concentration N type impurities. The P well 425 may be doped with low concentration P type impurities. The first diffusion region 431 and the third diffusion region 433 may be regions doped with higher concentration P type impurities than the P well 425. The second diffusion region 432, the fourth diffusion region 434, the fifth diffusion region 435 and the sixth diffusion region 436 may be N type conductivity type regions. For example, the second diffusion region 432, the fourth diffusion region 434, the fifth diffusion region 435 and the sixth diffusion region 436 may be regions doped with higher concentration N type impurities than the N well 120.

The electrostatic discharge protection device 400 may include a second gate electrode G2 formed on a second region R2 between the fifth diffusion region 435 and the sixth diffusion region 436. The electrostatic discharge protection device 400 may further include a first insulating layer provided between the first region R1 and the first gate electrode G1, and a second insulating layer provided between the second region R2 and the second gate electrode G2. A channel of a first NMOS transistor generated by the first gate electrode G1, the second diffusion region 432 and the sixth diffusion region 436 may be formed in the first region R1. A channel of a second NMOS transistor generated by the second gate electrode G2, the fifth diffusion region 435 and the sixth diffusion region 436 may be formed in the second region R2. The electrostatic discharge protection device 400 may further include a device isolation layer STI, which may be formed using a shallow-trench isolation technology, provided between the third diffusion region 433 and the fifth diffusion region 435.

A bias voltage Vbias may be supplied to the sixth diffusion region 436. For example, the bias voltage Vbias may be provided to the sixth diffusion region 436 through a conductive line 441. The first diffusion region 431 and the second diffusion region 432 may be connected to a cathode electrode. For example, a ground voltage may be provided through the cathode electrode. The third diffusion region 433 and the fourth diffusion region 434 may be connected to an anode electrode. For example, an electrostatic discharge (ESD) current may be input through the anode electrode. The first diffusion region 431, the second diffusion region 432 and the first gate electrode G1 may be connected to one another through a first resistor R1. The third diffusion region 433, the fourth diffusion region 434 and the second gate electrode G2 may be connected to one another through a capacitor C. The first gate electrode G1 and the second gate electrode G2 may be connected to each other.

To connect the above-mentioned elements to one another, a conductive line that connects the first diffusion region 431 and the second diffusion region 432 to the cathode electrode, a conductive line that connects the third diffusion region 433 and the fourth diffusion region 434 to the anode electrode, and a conductive line that connects the first gate electrode G1 to the second gate electrode G2 may be further provided.

Figure 16:
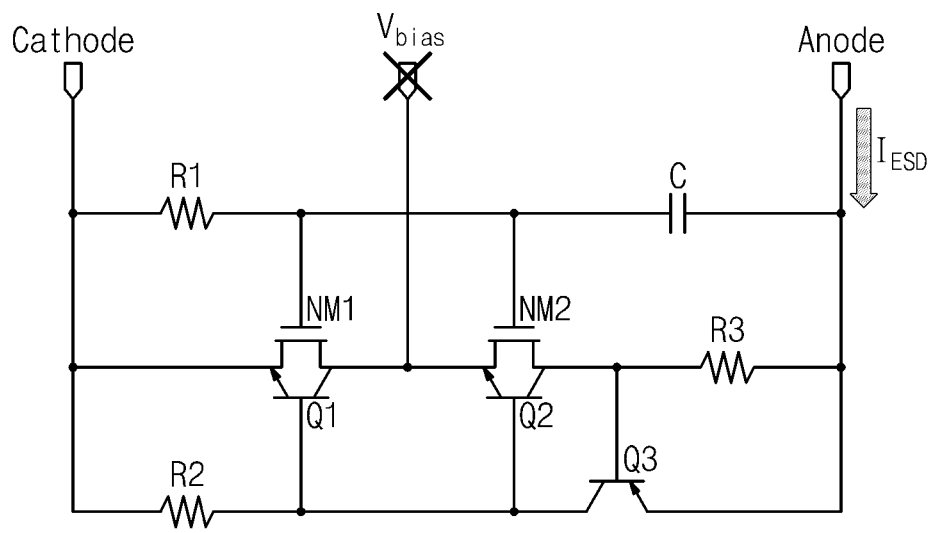
FIGS. 16 and 17 are illustrative equivalent circuits of the electrostatic discharge protection device illustrated in FIG. 15.
Figure 17:
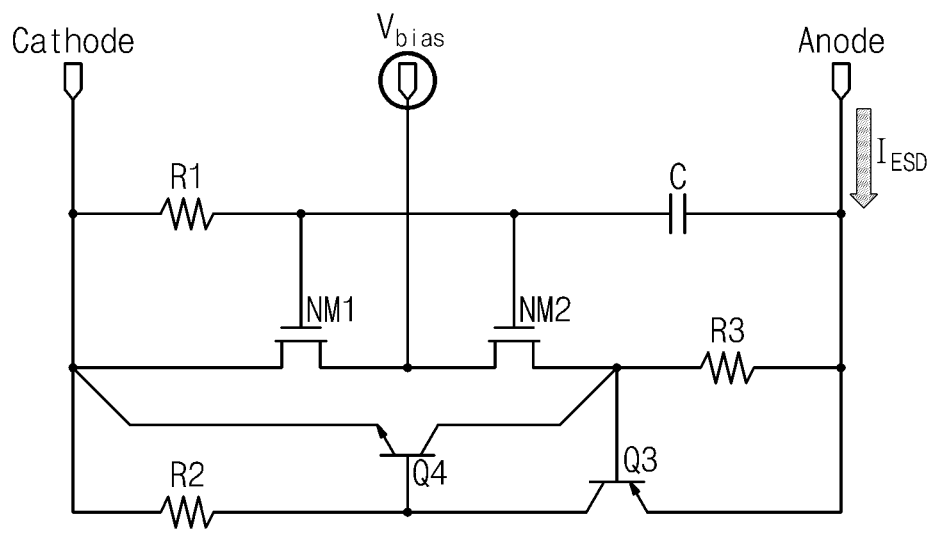

FIGS. 16 and 17 are illustrative equivalent circuits of an electrostatic discharge protection device illustrated in FIG. 15. FIG. 16 illustrates a case in which a bias voltage Vbias is not applied to the sixth diffusion region 436. FIG. 17 illustrates a case in which the bias voltage Vbias is applied to the sixth diffusion region 436.

Referring to FIGS. 15 and 16, when the bias voltage Vbias is not applied to the sixth diffusion region 436, a first BJT (Q1) constituted by the second diffusion region 432, the P well 425 and the sixth diffusion region 436 is turned on. A second BJT (Q2) constituted by the fifth diffusion region 435, the P well 425 and the sixth diffusion region 436 is also turned on. Thus, the ESD current $I_{ESD}$ input to the anode electrode flows into the cathode electrode along a surface of the substrate 410.

Referring to FIGS. 15 and 17, when the bias voltage Vbias is applied to the sixth diffusion region 436, the second BJT (Q2) is turned off by a reverse bias. A fourth BJT (Q4) constituted by the second diffusion region 432, the P well 425 and the fifth diffusion region 435 is instead turned on. As a result, the ESD current $I_{ESD}$ input to the anode electrode flows through a deeper region of the substrate 410 compared with a case in which the bias voltage Vbias is not applied. That is, since a resistance between the anode electrode of the electrostatic discharge protection device 400 and the cathode electrode thereof increases due to an increase of a length of the current path, a level of a holding voltage of the electrostatic discharge protection device 400 may be increased. Also, it is understood that, according to other exemplary embodiments, techniques other than applying a bias voltage may also be used to increase the resistance between the anode and cathode electrodes.

As described above, an incorrect operation due to a latch-up of the electrostatic discharge protection device may be prevented by placing a separate diffusion region that is provided with a bias voltage from the outside in the electrostatic discharge protection device. A holding voltage can be adjusted without increasing a size of the electrostatic discharge protection device by applying a bias voltage to the separate diffusion region. Additionally, when a device (e.g., SSD, smart phone, etc.) including the electrostatic discharge protection device is powered off, the bias voltage is not applied to the separate diffusion region and thereby the electrostatic discharge protection device can maintain a lower holding voltage as compared with when the bias voltage is applied to the separate diffusion region. As a result, damage due to deterioration can be minimized.

Figure 18:
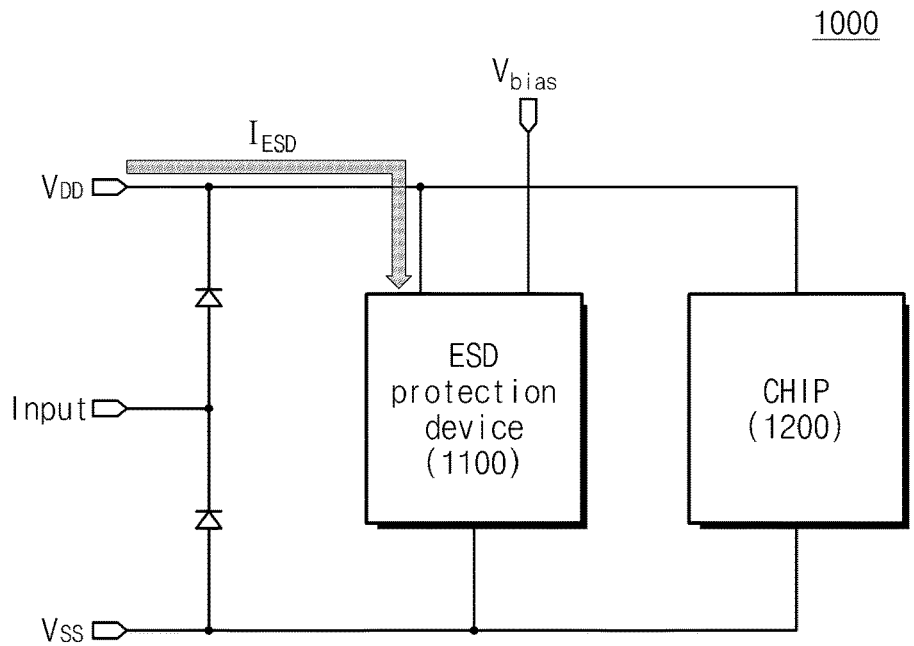
FIG. 18 is a block diagram illustrating a device including an electrostatic discharge protection device 1100 in accordance with an exemplary embodiment.

FIG. 18 is a block diagram illustrating a device 1000 including an electrostatic discharge protection device 1100 in accordance with another exemplary embodiment. The device 1000 may include the electrostatic discharge (ESD) protection device 1100 and a chip 1200. The ESD protection device 1100 may be implemented as any of the ESD protection devices 100, 200, 300, or 400, or a combination thereof. The chip 1200 may be implemented as many different types of chips, and may be a device supplied with a power supply $V_{DD}$ to drive the device 1000.

When the device 1000 is powered on (or is booted), the power supply $V_{DD}$ is supplied to the chip 1200. In this case, an ESD current $I_{ESD}$ may be generated and the electrostatic discharge protection device 1100 may be provided with a separate bias voltage Vbias from the outside and the bias voltage Vbias may be applied to a separate diffusion region prepared according to the exemplary embodiments to be used to increase a level of a holding voltage of the electrostatic discharge protection device 1100. In addition, since the bias voltage Vbias is applied only when the device 1000 is powered on (or is booted), the electrostatic discharge protection device 1100 can be prevented from being damaged by deterioration.

Figure 19:
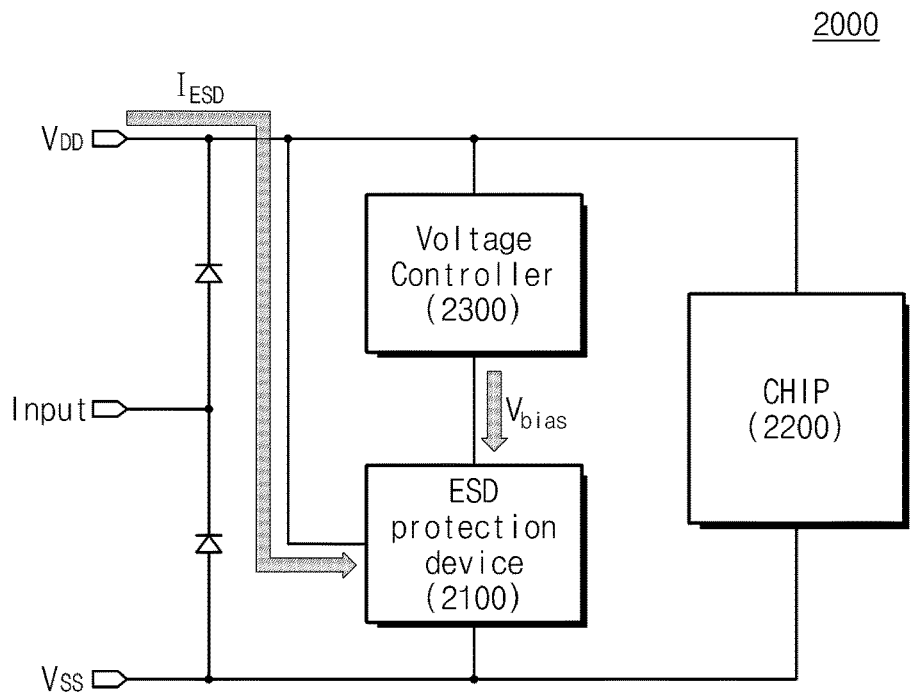
FIG. 19 is a block diagram illustrating a device including an electrostatic discharge protection device 2100 in accordance with an exemplary embodiment.

FIG. 19 is a block diagram illustrating a device 2000 including an electrostatic discharge protection device 2100 in accordance with an exemplary embodiment. The device 2000 may include the electrostatic discharge (ESD) protection device 2100, a chip 2200, and a voltage controller 2300. The ESD protection device 2100 may be implemented as any of the ESD protection devices 100, 200, 300, or 400, or a combination thereof. The present exemplary embodiment illustrates a case in which the electrostatic discharge protection device 2100 uses a voltage $V_{DD}$ for driving the chip 2200 instead of receiving a separate external bias voltage.

The voltage controller 2300 can use the voltage $V_{DD}$ for driving the chip 2200 to generate a bias voltage Vbias. The bias voltage Vbias generated by the voltage controller 2300 can applied to a separate diffusion region included in the electrostatic discharge protection device 2100 to be used to increase a level of a holding voltage of the electrostatic discharge protection device 2100.

According to exemplary embodiments disclosed herein, a holding voltage may be increased by increasing a resistance between an anode electrode and a cathode electrode without increasing a size of an electrostatic discharge protection device.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Although a few exemplary embodiments have been shown and described, it will be appreciated by those skilled in the art that changes may be made in these exemplary embodiments without departing from the principles and spirit of the exemplary embodiments, the scope of which is defined in the appended claims and their equivalents. Therefore, the above-disclosed subject matter is to be considered illustrative, and not restrictive.

What is claimed is:

1. An electrostatic discharge protection device comprising:
    a substrate comprising a well of a first conductivity type, the substrate being of a second conductivity type;
    a cathode electrode connected to the substrate;
    a first diffusion region of the second conductivity type and a second diffusion region of the first conductivity type, the first diffusion region and the second diffusion region being formed in the substrate and connected to the cathode electrode;
    an anode electrode connected to the substrate;
    a third diffusion region of the second conductivity type and a fourth diffusion region of the first conductivity type, the third diffusion region and the fourth diffusion region being formed in the well and connected to the anode electrode;
    a fifth diffusion region of the first conductivity type, the fifth diffusion region being formed on a border of the substrate and the well;
    a sixth diffusion region of the first conductivity type, the sixth diffusion region being formed in the substrate outside the well and between the first and second diffusion regions and the fifth diffusion region, and configured to directly receive a bias voltage from outside, the bias voltage being applied to increase a length of a current path from the anode electrode to the cathode electrode by reverse biasing a transistor formed by the sixth diffusion region, the substrate, and the fifth diffusion region;
    a first gate electrode formed on a first region between the second diffusion region and the sixth diffusion region;
    a second gate electrode formed on a second region between the fifth diffusion region and the sixth diffusion region; and
    a resistor connected to the cathode electrode,
    wherein the first gate electrode is connected to the cathode electrode through the resistor and the first gate electrode and the second gate electrode are connected to each other.

2. The electrostatic discharge protection device of claim 1, wherein the first conductivity type is an n conductivity type and the second conductivity type is a p conductivity type.

3. The electrostatic discharge protection device of claim 1, wherein the first diffusion region and the second diffusion region are formed to be adjacent to each other and the third diffusion region and the fourth diffusion region are formed to be adjacent to each other.

4. The electrostatic discharge protection device of claim 1, wherein a voltage level of the bias voltage is changed according to an electrostatic discharge current.

5. The electrostatic discharge protection device of claim 4, wherein the voltage level of the bias voltage is lower than a voltage level of the anode electrode.

6. The electrostatic discharge protection device of claim 1, wherein a doping concentration of the fifth diffusion region is higher than a doping concentration of the well.

7. The electrostatic discharge protection device of claim 1, further comprising a device isolation layer provided between the third diffusion region and the fifth diffusion region.

8. The electrostatic discharge protection device of claim 1, wherein the sixth diffusion region is further configured to directly receive the bias voltage via a conductive line that is connected between a source of the bias voltage and the sixth diffusion region.

9. The electrostatic discharge protection device of claim 1, further comprising a capacitor connected to the anode electrode,
wherein the second gate electrode is connected to the anode electrode through the capacitor.

10. The electrostatic discharge protection device of claim 1, wherein a level of a holding voltage of the electrostatic discharge protection device increases in response to the bias voltage being applied to the sixth diffusion region.

* * * * *